United States Patent [19]

Fallier, Jr. et al.

[11] Patent Number: 4,484,085
[45] Date of Patent: Nov. 20, 1984

[54] SPIRAL LINE VOLTAGE PULSE GENERATOR CHARACTERIZED BY SECONDARY WINDING

[75] Inventors: Charles N. Fallier, Jr., Westford; Joseph M. Proud, Wellesley Hills, both of Mass.

[73] Assignee: GTE Laboratories Incorporated, Waltham, Mass.

[21] Appl. No.: 426,427

[22] Filed: Sep. 29, 1982

[51] Int. Cl.³ .......................... H03K 3/53; H01G 4/32
[52] U.S. Cl. .................................. 307/106; 307/108; 315/209 CD; 361/271
[58] Field of Search ................ 307/106, 110, 108; 315/84.51, 85, 209 CD; 333/140; 331/87; 328/59, 65; 361/271, 433

[56] References Cited

U.S. PATENT DOCUMENTS

| | | | |
|---|---|---|---|
| 3,289,015 | 10/1964 | Fitch et al. | 307/110 |
| 4,217,468 | 8/1980 | Rice et al. | 178/116 |
| 4,325,004 | 4/1982 | Proud et al. | 315/45 |
| 4,353,012 | 10/1982 | Fallier, Jr. et al. | 315/289 |

OTHER PUBLICATIONS

Fitch and Howell, *Science and General*, Novel Principle of Transient High-Voltage Generation, Apr. 1964.

*Primary Examiner*—A. D. Pellinen
*Assistant Examiner*—Todd E. DeBoer
*Attorney, Agent, or Firm*—J. Stephen Yeo

[57] ABSTRACT

A spiral line voltage pulse generator includes a double arm spiral structure about which is wound an elongated conductor. The double arm structure includes two conductive strips which are electrically insulated so as to hold a charge. Upon discharge, electromagnetic force is coupled to the elongated conductor which functions as a secondary winding increasing the voltage which would be generated by the double arm structure alone. The elongated conductor may, for example, be a continuation of one of the conductor strips or a wire solenoid.

1 Claim, 5 Drawing Figures

SPIRAL LINE VOLTAGE PULSE GENERATOR CHARACTERIZED BY SECONDARY WINDING

BACKGROUND OF THE INVENTION

This invention pertains to voltage pulse generators, and more particularly, is concerned with spiral line pulse generators.

Spiral line pulse generators are described in U.S. Pat. No. 3,289,015 and in "Novel Principle of Transient High Voltage Generator" by Fitch et al, Proc-IEEE, Vol. 111, No. 4, April 1964.

A conventional spiral line pulse generator 10 is shown schematically in FIG. 1. A pair of conductors 11 and 12 in the form of elongated strips of conductive material are rolled together to form a double arm, multiple turn spiral structure. FIG. 2 is a partial cross-sectional view of the spiral line pulse generator 10 illustrating the layered construction of the device. A four layered arrangement of alternating conductors and insulators, including the conductive strips 11 and 12 and a pair of insulative strips 13 and 14, are rolled on a form 15 in a multiple turn spiral configuration. Form 15 provides mechanical rigidity. The conductive strips 11 and 12 are separated by the dielectric material of insulating strips 13 and 14 at every point in the spiral configuration. Conductive strip 12 runs from point 16 to point 17 while conductive strip 11 runs from point 18 to point 19. In the present example, a switch 20 is coupled between conductive strips 11 and 12 at or near the points 16 and 18; however, switch 20 can be across points 17 and 19 or even across the center of the strips. A voltage $V_o$ is applied between the conductive strips 11 and 12. Prior to the closing of the switch 20, the conductive strip 12 has a uniform potential between the points 16 and 17, and the conductive strip 11 has a uniform potential between the points 18 and 19. The voltage difference between the innermost and the outermost turns of the spiral configuration is at most $V_o$. This can be seen by summing the electric field vectors at time $t=0$ as shown in FIG. 2. When switch 20 is rapidly closed, a field reversing wave propagates along the transmission line formed by the conductive strips 11 and 12. When the wave reaches the points 17 and 19, at time $t=\tau$, the potential difference between the points 17 and 19 is $nV_o$, where n is the number of turns in the spiral configuration, due to the absence of cancelling static field vectors. The propagating wave undergoes an in-phase reflection at the points 19 and 17 when these points are terminated in a high impedance or are open circuited. This results in an additional increase in the potential difference between the innermost and outermost conductors with a maximum occurring at time $t=2\tau$, at which time the field vectors are aligned as shown in FIG. 1. The output taken between points 17 or 19 and point 16 reaches a maximum voltage of $2nV_o$ at $t=2\tau$ after the closure of the switch 20.

Proud et al in U.S. Pat. No. 4,325,004 teaches the use of a spiral line pulse generator to ignite a discharge lamp. For this, as well as other uses, cost and size are important factors. In particular, the dielectric material used for the insulating strips in high temperature applications, such as lamps, is expensive. In lamp circuits it is desirable to locate the pulse generator in the base of the lamp. Both size and cost can be reduced if a new spiral line generator could be devised which yields the voltage output of conventional spiral line pulse generators, but with fewer turns.

Furthermore, it has been observed that the output of a conventional spiral line pulse generator drops considerably when contained in a metal housing such as a lamp base. This loss is due to the shorted turn effect of electromagnetic fields extending to the metal housing. It would be desirable to reduce this loss due to the shorted turn effect by concentrating the electromagnetic field close to active layers of the spiral line structure.

SUMMARY OF THE INVENTION

Accordingly, it is an object of this invention to provide an improved spiral line pulse generator having a smaller size and using less dielectric material than an equivalent conventional spiral line pulse generator.

Yet another object is to provide an improved spiral line pulse generator which is affected less by containment in a metal enclosure than conventional spiral line pulse generators.

Briefly, there is provided a spiral line voltage pulse generator in which first and second conductive strips are wound in a double arm spiral structure about an axis. The conductive strips are insulated from each other. As a feature of the invention, an elongated conductor extends from one of the conductive strips and is wound about the outside of the double arm spiral. The conductive strips are charged to a potential by a voltage source. When the strips are connected through a switch or the like, a voltage wave and a corresponding current wave propagate along the conductive strip. An enhanced voltage pulse is generated by current flow through the conductive strips.

The elongated conductor may, for example, be a continuation of one of the conductive strips; that is to say, one of the conductive strips is longer than the other, with the excess wound in a single arm spiral over the double arm structure.

As another example, the elongated conductor may be a wire, one end of which is connected to the end of one of the conductive strips.

DESCRIPTION OF THE INVENTION

As a feature of the invention, an elongated conductor is wound with multiple turns about the periphery of a double arm spiral line structure. One end of the elongated conductor is electrically common to the outer end of one of the two conductive strips.

Figure 1:
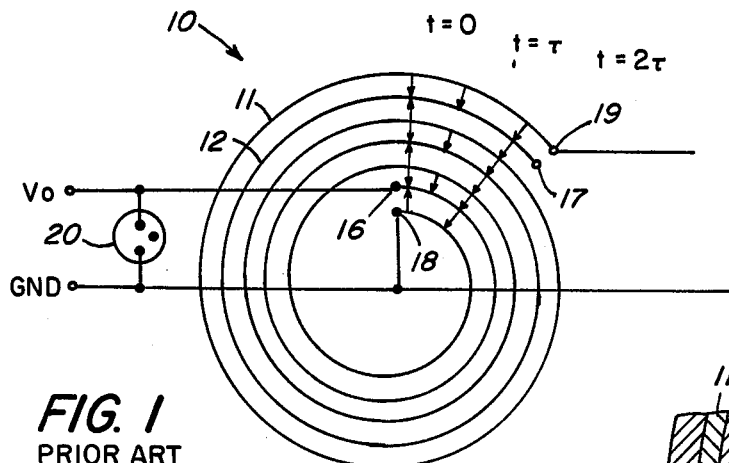
FIG. 1 is a schematic representation of a double arm spiral line pulse generator known from the prior art.
Figure 2:
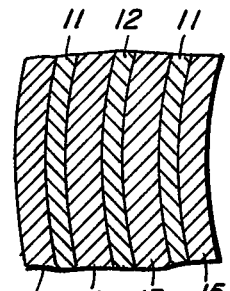
FIG. 2 is a cross-sectional view of the pulse generator of FIG. 1.

The double arm spiral structure 10 is similar to the structure earlier seen in FIG. 1 and includes two conductive strips 11, 12 coiled about an axis. The conductive strips 11, 12 are electrically separated from each other by two insulative strips 13, 14 arranged in alternate layers with conductive strips 11, 12. The insulative strips 13, 14 are wider than the conductive strips 11, 12 to prevent arcing between edges of the conductive strips. A coaxial form 15 gives support to the strips.

Figure 3:
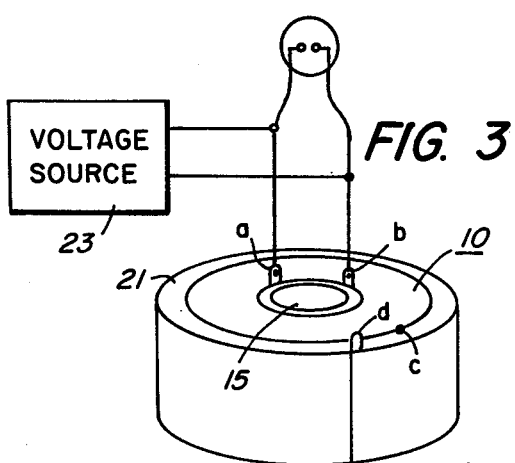
FIGS. 3 and 4 are a pictorial and a schematic view, respectively, of a voltage pulse generator according to the invention.
Figure 4:
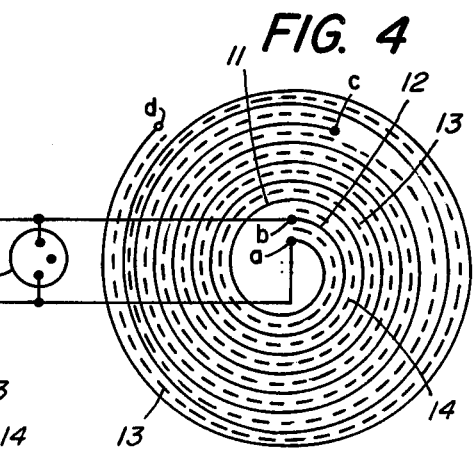

FIG. 3 is a pictorial representation and FIG. 4 is a schematic representation of an embodiment wherein the elongated conductor is a continuation 21 of one of the conductive strips 11 or 12; that is to say, one conductive strip is substantially longer than the other. Corresponding points are identified by the letters a, b, c, and d. The continuation 21 is wound as a multiple turn single arm spiral over the periphery of the double arm spiral 10. One of the insulative strips is also continued to insulate the turns of the single arm spiral from each other. The output of the generator may be coupled from the end of the continuation at point d.

Figure 6:
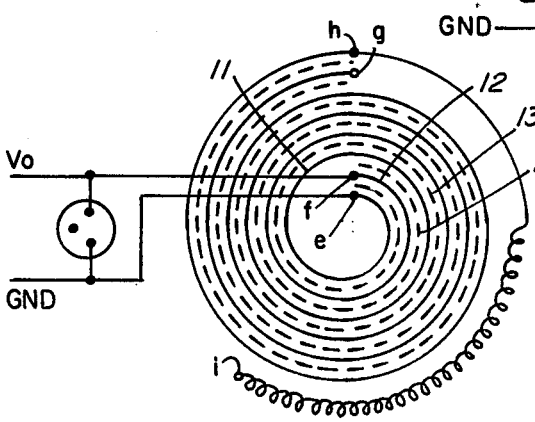
FIGS. 5 and 6 are a pictorial and a schematic view, respectively, of another voltage pulse generator according to the invention.
Figure 5:
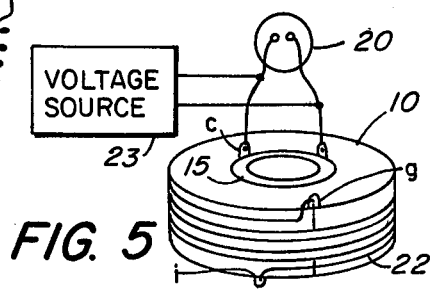

FIG. 5 is a pictorial representation and FIG. 6 is a schematic cross section of an alternate embodiment wherein the elongated conductor is a wire 22, wound as a solenoid over the periphery of the double arm spiral 10. Corresponding points are identified by the letters e, f, g, h and i. One end of the wire is electrically connected to one of the conductive strips at point h. The wire is insulated so that turns of the solenoid are insulated from each other. The generator output pulse appears at the free end of the wire at point i.

In both of these embodiments, tabs or other means adapt conductive strips to be connected to a voltage source 23 and to be shunted by a normally open low inductance switch 20 such as a spark gap. A switch 20 is shown connected to the inner ends of the conductive strips: a, b and c, d, but can be connected at other points, such as on the outer ends or across the center of the conductive strips 11, 12.

Energy is supplied to the spiral line by voltage source 22 and is capacitively stored until closing of switch 20 electrically connecting points of the conductive strips 11, 12. A voltage wave and corresponding current wave propagates along the transmission line formed by the conductive strips 11, 12. The changing current flow through the conductive strips generates a corresponding electromagnetic field which is inductively coupled to the elongated conductor. An output voltage pulse higher than that obtainable from the spiral line generator alone appears on the elongated conductor.

Several voltage pulse generators were constructed as described. A generator featuring a wire solenoid was fabricated using one-quarter inch (63 mm) wide strips of one mil (25.4 m) thick aluminum as the conductive strips. Three-eighths inch (95 mm) wide strips of one mil (25.4 m) thick polymide were used as the insulatve strips. The strips were wound on a three-quarter inch (190 mm) form for support. The first conductive strip had eleven turns and the second conductive strip had ten turns. Ten turns of 27 gauge enameled wire was wound as a single layer solenoid over the exposed end of the first conductive layer. One end of the wire was soldered to the outer end of the second conductive strip. The other end of the wire was the output of the pulse generator. Voltage, ground, and output connectors were made by means of tabs spot welded or soldered to the conductive strips. A spark gap switch with a breakdown voltage of 470 volts was connected shunt across the inner ends of the conductive strips. Voltage was applied to the inner ends of the conductive strips until the spark gap broke down, causing a reversing voltage wave and a corresponding current wave to flow through the spiral line. A voltage pulse of 5.9 kilovolts peak appeared at the free end of the wire solenoid. This is about twice the voltage that would be expected without the wire solenoid. This voltage pulse generator was used to successfully ignite a 175 watt metal halide metal discharge lamp.

One application of the voltage pulse generator is to start discharge lamps which require a voltage pulse substantially higher than operating voltage. A pulse generator according to the invention was tested within a metallic lamp base. It was found that its output voltage was 90 percent of the voltage obtained when the generator was located in an open area, indicating only minimal shorted turn effects.

Embodiments of the invention have been illustrated and described as examples of the invention. Numerous modifications are readily apparent, particularly electrical location of the discharge switch and voltage source. Therefore, the scope of our invention is defined by the claims, in which:

We claim:

1. A voltage pulse generator comprised of:
    a first conductive strip;
    a second conductive strip electrically insulated from said first conductive strip;
    said first and second conductive strips coiled in a double arm spiral structure about an axis;
    an elongated conductor electrically common to one of said conductive strips, said elongated conductor wound with a plurality of turns about the periphery of said double arm spiral structure;
    means for charging said conductive strips to a voltage potential; and
    switching means for electrically connecting said conductive strip, thereby causing a voltage wave and a corresponding current wave to propagate along said conductive strips whereupon an enhanced voltage pulse appears on said elongated conductor;
    wherein said conductive strips have approximately equal lengths and said elongated conductor is a wire solenoid about the periphery of said double arm structure, one end of which is electrically connected to the end of one of said conductive strips.

* * * * *